(12) United States Patent
Kojima

(10) Patent No.: US 8,835,192 B2
(45) Date of Patent: Sep. 16, 2014

(54) METHOD OF MANUFACTURING LIGHT-EMITTING DEVICE

(75) Inventor: Takeshi Kojima, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 13/817,371

(22) PCT Filed: Aug. 2, 2011

(86) PCT No.: PCT/JP2011/067635
§ 371 (c)(1),
(2), (4) Date: Feb. 15, 2013

(87) PCT Pub. No.: WO2012/023425
PCT Pub. Date: Feb. 23, 2012

(65) Prior Publication Data
US 2013/0149801 A1 Jun. 13, 2013

(30) Foreign Application Priority Data
Aug. 17, 2010 (JP) .................. 2010-182211

(51) Int. Cl.
*H01L 33/50* (2010.01)

(52) U.S. Cl.
USPC .............................. 438/16; 438/29

(58) Field of Classification Search
USPC ............... 438/16, 29, 82, 99; 257/79–100; 347/22, 29, 30, 87
See application file for complete search history.

(56) References Cited

U.S. PATENT DOCUMENTS

| | | | |
|---|---|---|---|
| 6,789,874 B1 | 9/2004 | Dietl | |
| 7,390,684 B2 * | 6/2008 | Izuno et al. | 438/29 |

FOREIGN PATENT DOCUMENTS

| | | |
|---|---|---|
| CN | 101296982 | 10/2008 |
| CN | 101679861 | 3/2010 |
| JP | 11-106685 A | 4/1999 |
| JP | 11106685 A * | 4/1999 |
| JP | 11-251640 A | 9/1999 |
| JP | 2001-181614 A | 7/2001 |
| JP | 2002-185046 A | 6/2002 |
| JP | 2002-314142 A | 10/2002 |
| JP | 2004-153109 A | 5/2004 |
| JP | 2008-227458 A | 9/2008 |
| JP | 2010-80588 A | 9/2008 |
| JP | 4306224 B2 | 7/2009 |
| JP | 2009-256670 A | 11/2009 |

OTHER PUBLICATIONS

U.S. Office Action dated Dec. 6, 2013 for U.S. Appl. No. 13/817,320 (11 pages).
Chinese Office Action, Application No. 201180040060.0. Issuing Date: Feb. 18, 2014 (5 pages).
English translation of Chinese Office Action, Application No. 201180040060.0. Issuing Date: Feb. 18, 2014 (4 pages).
Korean Office Action, Patent Application 10-2013-7003657, Mailing Date: Mar. 20, 2014 (3 pages).
English translation of Korean Office Action, Patent Application 10-2013-7003657, Mailing Date: Mar. 20, 2014 (3 pages).

* cited by examiner

*Primary Examiner* — Reema Patel
*Assistant Examiner* — Syed Gheyas
(74) *Attorney, Agent, or Firm* — Lucas & Mercanti, LLP

(57) ABSTRACT

A method of manufacturing a light-emitting device includes forming wave length conversion portion on a light-emitting element. The light emitting device includes a light-emitting element which emits light of a predetermined wavelength and a wavelength conversion portion which includes a fluorescent substance which is excited by the light emitted from the light-emitting element so as to emit fluorescence of a wavelength different from the predetermined wavelength, which wavelength conversion portion is formed by including the fluorescent substance, a layered silicate mineral, and an organometallic compound. The forming the wavelength conversion portion includes forming a fluorescent substance layer on the light-emitting element using a fluorescent substance dispersion liquid including a fluorescent substance and a layered silicate mineral, applying a precursor solution including an organometallic compound on the light-emitting element, and heating the precursor solution applied on the fluorescent substance layer.

20 Claims, 3 Drawing Sheets

METHOD OF MANUFACTURING LIGHT-EMITTING DEVICE

CROSS REFERENCE TO RELATED APPLICATION

This Application is a 371 of PCT/JP2011/067635 filed on Aug. 2, 2011, which claimed the priority of Japanese Patent Application No. 2010-182211 filed on Aug. 17, 2010, both applications are incorporated herein by reference in its entirety.

TECHNICAL FIELD

The present invention relates to a method of manufacturing a light-emitting device.

BACKGROUND ART

In recent years, there has been a widely-used technology for obtaining white LEDs by arranging a fluorescent substance such as a YAG fluorescent substance around gallium nitride (GaN) blue light-emitting diode (LED) chips to mix blue light emitted from the GaN blue LED chips and yellow light emitted by secondary light emission from the fluorescent substance which has received the blue light.

As for such white LEDs, it is commonly performed to seal LED chips or their mounting areas with a transparent resin dispersing a fluorescent substance therein. However, since specific gravity of a fluorescent substance is larger than a transparent resin, a fluorescent substance settles before the resin hardens, which causes color unevenness in light emission.

Given the above, there have been proposed a variety of methods for suppressing settlement of a fluorescent substance to avoid color unevenness. For example, Patent Document 1 discloses that settlement or segregation of a fluorescent substance can be suppressed by using a silicone resin as a sealant, which resin has a viscosity of from 100 to 1000 cP when it hardens. Further, Patent Document 2 discloses a chip-part type LED configured such that LED elements are arranged between the upper end opening and the bottom end opening of a cylindrical container, the cylindrical container is filled with a translucent resin from the upper end opening to the bottom end opening, and the inner face of the container is formed so as to reflect light emitted from the LED element to the upper end opening.

Still further, Patent Document 3 discloses a light-emitting device composed of a liquid translucent sealant material and a lipophilic compound added thereto as an anti-settlement agent, which compound prepared by adding organic cations to a layered, compound mainly composed of a clay mineral, and discloses a manufacturing method thereof.

PRIOR ART DOCUMENTS

Patent Documents

Patent Document 1: Japanese Patent Application Publication No. 2002-314142.

Patent Document 2: Japanese Patent Application Publication No. 2002-185046.

Patent Document 3: Japanese Patent Application Publication No. 2004-153109.

SUMMARY OF THE INVENTION

Problem to be Solved by the Invention

In Patent Document 1, however, since LED chips are sealed with a silicone resin, deterioration of a sealant material such as coloration is easily developed by light emitted from the LED chips, heat generated by the LED chips and the fluorescent substance, and the like. Thus, it is difficult to achieve durability for a long-term use. Further, as for the configuration of Patent Document 2, the structure of LED is complex, which causes a cost increase. Still further, in Patent Documents 2 and 3, resin materials such as an epoxy resin, a silicone resin, and a polyimide resin are described as exemplary translucent sealant materials, but these resins are not adequate in terms of durability of a sealant material, like Patent Document 1.

Given the above, to improve heat and light durability of LED chips, LED chips can be sealed with a sealant material which is turned into ceramic after heated. In such a case, when the layered compound described in Patent Document 3 is added as a settlement inhibiting agent, a dispersed state of a fluorescent substance is stabilized. Thus, occurrence of color unevenness can be reduced. However, because viscosity of a liquid mixture of the sealant material and the settlement inhibiting agent is small, the fluorescent substance settles before the sealant material hardens, i.e., a settlement-suppressing effect is inefficient.

Therefore, a main purpose of the present invention is to provide a method of manufacturing a light-emitting device which includes a wavelength conversion portion where a fluorescent substance is dispersed evenly in a translucent material having a high heat durability.

Means for Solving the Problem

In order to solve the above problems, according to the present invention, there is provided a method of manufacturing a light emitting device which includes a light-emitting element which emits light of a predetermined wavelength and a wavelength conversion portion which includes a fluorescent substance which is excited by the light emitted from the light-emitting element so as to emit (generate) fluorescence of a wavelength different from the predetermined wavelength, the wavelength conversion portion being formed by including the fluorescent substance, a layered silicate mineral, and an organometallic compound, and the method includes forming a wave length conversion portion on a light-emitting element, wherein the forming the wavelength conversion portion includes forming a fluorescent substance layer on the light-emitting element using a fluorescent substance dispersion liquid including a fluorescent substance and a layered silicate mineral; applying a precursor solution including an organometallic compound on the light-emitting element; and heating the precursor solution applied on the fluorescent substance layer.

Effect of the Invention

According to the present invention, the fluorescent substance can be applied on the light-emitting element in a well-dispersed state, because the fluorescent substance dispersion liquid and the precursor solution are separately applied. Thus, the wavelength conversion portion where the fluorescent substance is evenly dispersed in the translucent material having a high heat durability can be formed.

EMBODIMENTS FOR CARRYING OUT THE INVENTION

Hereinafter, preferred embodiments of the present invention will be described with reference to the drawings.

First Embodiment

Figure 1:
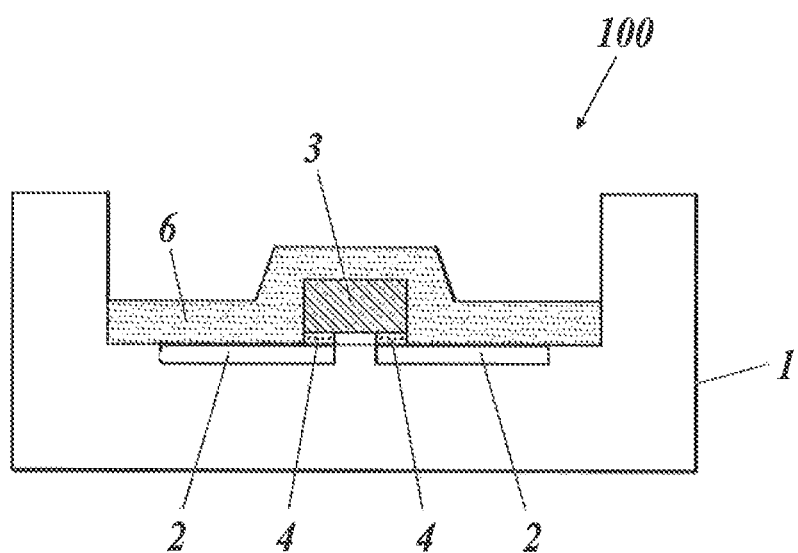
FIG. 1 This is a cross-sectional view illustrating a schematic configuration of a light-emitting device, FIG. 2 This is a schematic diagram, for explaining schematically a manufacturing device and a manufacturing method of a light-emitting device of a first embodiment.

As illustrated in FIG. 1, a light-emitting device 100 has an LED substrate 1 whose cross-section is concave.

On a concave portion (the bottom portion) of the LED substrate 1, a metal portion 2 is arranged. Above the metal portion 2, an LED element 3 in a rectangular shape is arranged. The LED element 3 is an example of a light-emitting element which emits light of a predetermined wavelength.

On the surface of the LED element 3 facing to the metal portion 2, projecting electrodes 4 are arranged. The metal portion 2 and the LED element 3 are connected with each other through the projecting electrodes 4 (flip-chip type).

Although illustrated here is the configuration such that one LED element 3 is arranged on one LED substrate 1, a plurality of the LED elements 3 can be arranged on the concave portion of one LED substrate 1.

In this embodiment, a blue LED element is used as the LED element 3.

The blue LED element is, for example, constituted of a laminate of an n-GaN cladding layer, an InGaN fluorescent layer, a p-GaN cladding layer and a transparent electrode on a sapphire substrate.

On the concave portion of the LED substrate 1, a wavelength conversion portion 6 is formed so as to seal a surrounding area of the LED element 3.

The wavelength conversion portion 6 is a portion which converts light of a predetermined wavelength, emitted from the LED element 3 to light of a wavelength different from the emitted light, and where a fluorescent substance which is excited with the wavelength from the LED element 3 and emits fluorescence of a wavelength different from, the exciting wavelength is added in a translucent ceramic layer. Although the wavelength conversion portion 6 is formed so as to seal a surrounding area of the LED element 3 in this embodiment, the wavelength conversion portion 6 can be formed just around (on the upper and the side faces of) the LED element 3, and thus there can be a configuration such that the wavelength conversion portion 6 is not formed on the concave portion of the LED substrate 1.

As for a method of forming the wavelength conversion portion 6 just around the LED element 3, an available method is, for example, placing a mask when the wavelength conversion portion 6 is formed.

Next, a configuration of the wavelength conversion portion 6 and the like will be described in detail.

The wavelength conversion portion 6 is a clear ceramic layer (glass body) formed by turning a sol precursor solution where an organometallic compound is mixed with an organic, solvent into a gel by heating followed by firing, which is called the sol-gel method. The clear ceramic layer includes the fluorescent substance, the layered silicate mineral, and inorganic fine particles.

(Organometallic Compound)

The organometallic compound functions as a binder for sealing the fluorescent substance, the layered silicate mineral, and the inorganic fine particles.

As for the organometallic compound used in the present invention, such as a metal alkoxide, a metal acetylacetonate, a metal carboxylate can be given as the examples. A metal alkoxide, which is easily turned into a gel by hydrolysis and polymerization, is suitable.

A metal alkoxide can be monomolecular such as tetraethoxysilane, or can be a polysiloxane constituted of a chain or a ring of organosiloxane compounds. A polysiloxane which increases viscosity of the precursor solution is suitable.

Types of metals of a metal alkoxide are not limited as long as a translucent glass body can be formed. Preferably, in terms of stability of a formed glass body and easiness of manufacturing thereof, silicon is included in a metal alkoxide. A plurality types of metals can be included therein.

If a content of the organometallic compound in the ceramic layer is less than 2% by weight, an amount of the organic compound as a binder is so low that strength of the ceramic layer after heated and fired decreases.

On the other hand, if the content of the organometallic compound in the ceramic layer is more than 50% by weight, contents of the layered silicate mineral and the inorganic fine particles are relatively low, and thus strength of the ceramic layer decreases.

Therefore, the content of the organometallic compound in the ceramic layer ranges preferably from 2 to 50% by weight, and more preferably from 2.5 to 30% by weight.

As the organometallic compound, a polysilazane can be used. A polysilazane used in the present invention is represented by the following general formula (1):

$$(R1R2SiNR3)_n \qquad (1)$$

In the formula (1), R1, R2 and R3 independently represent hydrogen, an alkyl group, an aryl group, a vinyl group, or a cycloalkyl group. At least one of R1, R2 and R3 is hydrogen, and preferably all of R1, R2 and R3 are hydrogen, and "n" represents an integral number ranging front 1 to 60.

A Polysilazane can be in any molecular shape, for example, can be a straight chain or a ring.

A polysilazane represented by the above formula (1) and a reaction accelerating agent as needed are dissolved in an appropriate solvent, and application thereof is performed, and subsequently hardening is performed by heating, excimer light treatment, or UV light treatment. By the above, a ceramic layer-having a high heat and light durability can be formed. Especially, hardening by irradiation of UVU radiation including light of wavelength of from 170 to 230 nm (for example, excimer light) followed by heat hardening further enhances a water seepage-preventing effect.

As for the reaction accelerating agent, an acid or a base is suitably used. However, the reaction accelerating agent is not essential.

As for the reaction accelerating agent, such as triethylamine, diethyl amine, N,N-dimethylethanolamine, triethanolamine, triethylamine, hydrochloric acid, oxalic acid, fumaric acid, sulfonic acid, acetic acid, and a metal carboxylate salt including a metal such as nickel, iron, palladium, iridium, platinum, titan, or aluminum, can be given as the examples. However, the reaction accelerating agent is not limited to the above.

If the reaction accelerating agent is used, a metal carboxylate salt is especially suitable. An amount thereof to be added ranges preferably from 0.01 to 5 mol % on the basis of a polysilazane.

As for the solvent, an aliphatic hydrocarbon, an aromatic hydrocarbon, a halogen hydrocarbon, an ether, or an ester can be used. Methylethylketone, tetrahydrofuran, benzene, toluene, xylene, dimethylfluoride, chloroform, tetrachloromethane, ethylether, isopropylether, dibutylether, or ethylbutylether is suitable.

A concentration of a polysilazane is preferably high. However, because a high concentration causes a shorter period of conserving a polysilazane, a polysilazane is dissolved in a solvent preferably from 5 to 50 wt % (% by weight).

If a polysilazane solution is used as the ceramic precursor solution, in terms of suppressing deterioration of the glass material or the like used for a substrate, heating temperature in firing (firing temperature) ranges preferably from 150 to 500° C., and more preferably from 150 to 350° C.

(Fluorescent Substance)

The fluorescent substance is excited with a wavelength of light emitted from the LED element 3 (an exciting wavelength), and emits fluorescence of a wavelength different from the exciting wavelength.

In the embodiment, used is a YAG (yttrium•aluminum•garnet) fluorescent substance, which converts blue light (of wavelengths from 420 to 485 nm) emitted from a blue LED element to yellow light (of wavelengths from 550 to 650 nm).

For such a fluorescent substance, oxides of Y, Gd, Ce, Sm, Al, La, or Ga, or compounds that are easily turned into oxides at a high temperature, are used and mixed well in a stoichiometric ratio to obtain a raw mixture. Otherwise, a solution obtained by dissolving Y, Gd, Ce and Sm, which are rare earth, elements, in an acid in a stoichiometric ratio is coprecipitated with oxalic acid, and fired to obtain coprecipitated oxide. Subsequently, the coprecipitated oxide is mixed with aluminum oxide and gallium oxide to obtain a raw mixture.

Thereafter, an adequate amount of a fluoride such as ammonium fluoride as a flux is mixed with the obtained, raw mixture, and pressure is applied thereto, to obtain compact.

The obtained compact is put in a crucible, and fired at a temperature ranging from 1350 to 1450° C. for from 2 to 5 hours to obtain a sintered compact having a light-emitting characteristics of a fluorescent substance.

Although a YAG fluorescent substance is used in the embodiment, a type of a fluorescent substance to be used is not limited thereto. For example, other fluorescent substance such as a non-garnet fluorescent substance containing no Ce can be used. A larger particle diameter of a fluorescent substance provides a higher light-emitting efficiency (wavelength conversion efficiency), while providing bigger apertures formed around the interface between the organometallic compound and the fluorescent substance and a weaker layer strength of the ceramic layer.

Thus, considering light-emitting efficiency and volume of apertures formed on the interface of the organometallic compound and the fluorescent substance, it is preferable to use a fluorescent substance having an average particle diameter ranging from 1 to 50 µm. The average particle diameter of a fluorescent substance can be measured by, for example, the Coulter Counter Method.

(Layered Silicate Mineral)

The layered silicate mineral is preferably a swelling-clay mineral having the micaceous structure, the kaolinite structure, the smectite structure, or the like. The smectite structure, which swells well, is especially suitable. This is because, as described below, water added to the fluorescent substance dispersion liquid enters into layer gaps of the smectite structure, and swells the structure to form a card house structure. Thus, even an added amount is small, viscosity of the fluorescent substance dispersion liquid can be much increased.

In addition, because the layered, silicate mineral is in a plate-like structure in the ceramic layer, layer strength of the ceramic layer can be enhanced.

If a content of the layered silicate mineral in the ceramic layer is less than 0.5% by weight, an effect for increasing viscosity of the fluorescent substance dispersion liquid cannot be sufficiently obtained.

On the other hand, if the content of the layered silicate mineral is more than 20% by weight, strength of the ceramic layer decreases.

Thus, the content of the layered silicate mineral ranges preferably from 0.5 to 20% by weight, and more preferably from 0.5 to 10% by weight.

Here, considering affinity of the layered silicate mineral for the organic solvent, a layered silicate mineral whose surface is modified (a surface treatment) with an ammonium salt or the like can also be used as needed.

(Inorganic Fine Particle)

The inorganic fine particles possess a filling effect for filling apertures therewith formed around the surfaces of the fluorescent substance and the layered silicate mineral; a viscosity-increasing effect for increasing viscosity of the fluorescent substance dispersion liquid; and a layer strength-enhancing effect for enhancing layer strength of the ceramic layer.

As for the inorganic fine particles used in the present invention, oxide fine particles of such as a silicon oxide, a titanium oxide, zinc oxide, and fluoride fine particles of such as magnesium fluoride can be given as the examples. Especially, when an organic compound including silicon such as a polysiloxane is used as the organometallic compound, in terms of stability of the inorganic fine particles to the ceramic layer to be formed, silicon oxide fine particles are suitably used.

If a content of the inorganic fine particles in the ceramic layer is less than 0.5% by weight, each of the above-mentioned effects cannot be sufficiently obtained.

On the other hand, if the content of the inorganic fine particles in the ceramic layer is more than 50% by weight, strength of the ceramic layer decreases.

Thus, the content of the inorganic fine particles in the ceramic layer is set to be from 0.5 to 50% by weight.

Preferably, the content of the inorganic fine particles in the ceramic layer ranges from 0.5 to 40% by weight.

In addition, considering each of the above-mentioned effects, an average particle diameter of the inorganic fine particles ranges preferably from 0.001 to 50 µm, and more preferably from 0.005 to 20 µm.

The average particle diameter of the inorganic fine particles can be measured by, for example, the Coulter Counter Method.

Here, considering affinity of the inorganic fine particles for the organometallic compound and the organic solvent, inorganic fine particles whose surfaces are modified with a silane coupling agent or a titanate coupling agent can also be used as needed.

(Precursor Solution)

The precursor solution is a mixture of the organometallic compound with the organic solvent. By heating the precursor solution, the translucent ceramic layer can be obtained. The precursor solution is applied on the light-emitting element on which the fluorescent substance dispersion liquid where the fluorescent substance, the layered silicate mineral, and the inorganic fine particles are mixed has been applied, and subsequently heating is performed thereon, to form the wavelength conversion portion 6.

As for the organic solvent, an alcohol such as methanol, ethanol, propanol, butanol, or the like is suitable.

If a mixture amount of the organometallic compound to the organic solvent is less than 5% by weight, it is difficult to increase viscosity of the precursor solution. If the mixture amount of the organometallic compound to the organic solvent is more than 50% by weight, polymerization reaction becomes too fast beyond necessity.

Thus, the mixture amount of the organometallic compound to the organic solvent ranges preferably from 5 to 50% by weight, and more preferably from 8 to 40% by weight.

(Fluorescent Substance Dispersion Liquid)

The fluorescent substance dispersion liquid is a solution containing the fluorescent substance and the layered, silicate mineral, and preferably, further containing the inorganic fine particles.

A preparation protocol of the fluorescent substance dispersion liquid is, for example, if a lipophilic layered silicate mineral whose surface is treated is used, such that the layered silicate mineral is pre-mixed with the organic solvent first, and subsequently, the fluorescent substance, the inorganic fine particles, and water are mixed therewith.

When water is added to the fluorescent substance dispersion liquid, water enters into layer gaps of the layered silicate mineral, and thus viscosity of the fluorescent substance dispersion liquid increases. Accordingly, settlement of the fluorescent substance can be suppressed.

As for the organic solvent, an alcohol that has a high solubility in water, such as methanol, ethanol, propanol, butanol, or the like is suitable.

On the other hand, if a hydrophilic layered silicate mineral whose surface is not treated is used, the layered silicate mineral is pre-mixed with water first, and subsequently, the fluorescent substance and the inorganic fine particles are mixed, therewith.

By the above, the layered silicate mineral can be evenly mixed, and the viscosity-increasing effect can be much enhanced.

A preferred viscosity of the fluorescent substance dispersion liquid ranges from 25 to 800 cP, and the most preferred viscosity ranges from 30 to 500 cP.

If water contains impurities, polymerization of the precursor solution may be suppressed. Thus, it is required that water to be added is purified water containing no impurities.

When water is added to the organic solvent, a proportion of water to the total amount, of the solvent is set be 5% or more by weight. If the proportion of water is less than 5% by weight, the viscosity-increasing effect mentioned above is not sufficiently obtained. If the proportion of water is more than 60% by weight, the viscosity-increasing effect, is surpassed by a viscosity-decreasing effect resulted from addition of excess water.

Thus, the proportion of water to the total solvent ranges preferably from 5 to 60% by weight, and more preferably from 7 to 55% by weight.

A most preferred composition range of each of the above-mentioned materials in the fluorescent substance dispersion liquid is from 0.1 to 5% the layered silicate mineral and from 1 to 40% the inorganic fine particles by weight.

Here, as for the layered silicate mineral, a layered silicate mineral having the smectite structure is suitably used.

Next, a method of manufacturing a light-emitting device 100 (a wavelength conversion portion 6) will be described.

Figure 2:
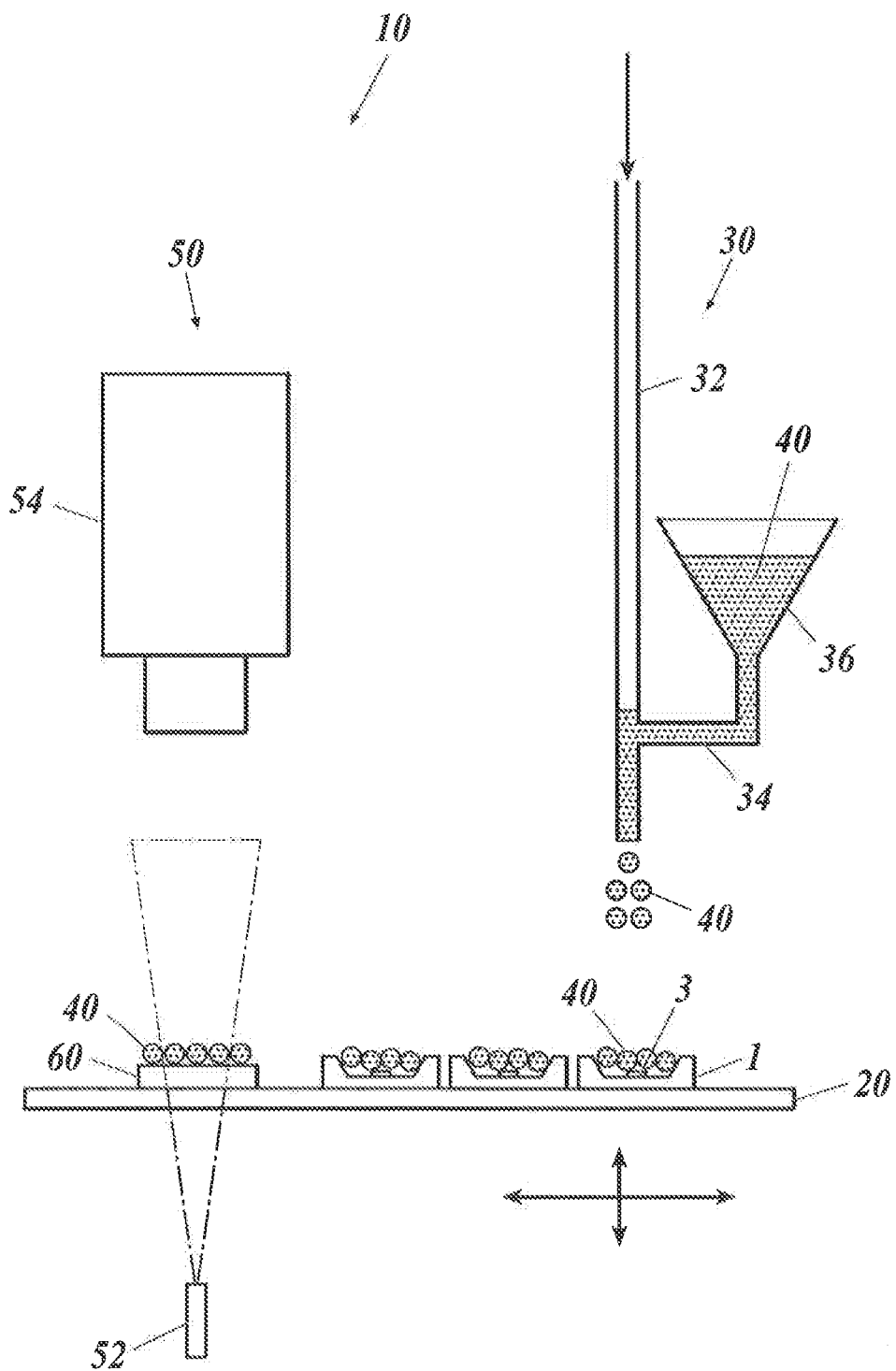

To manufacture the wavelength conversion portion 6 of the light-emitting device 100, for example, a manufacturing device 10 of FIG. 2 is used.

The manufacturing device 10 principally includes: a movable carriage 20 which can be moved upward, downward, leftward, rightward, forward and backward; a spraying unit 30 which can spray the above-described fluorescent substance dispersion liquid or the above-described precursor solution as an application liquid 40; and an inspecting unit 50 which can inspect such as chromaticity and brightness of the wavelength conversion portion 6.

The spraying unit 30 is arranged above the movable carriage 20.

The spraying unit 30 has a nozzle 32 to which air is supplied.

Here, the spraying unit 30 can be arranged below the movable carriage 20 and can spray the application liquid 40 upwards.

A pore diameter of the tip of the nozzle 32 ranges from 20 μm to 2 mm, and preferably from 0.1 to 0.3 mm. The nozzle 32 can be moved upward, downward, leftward, rightward, forward and backward like the movable carriage 20. Particularly, an angle of the nozzle 32 can also be adjusted, and thus the nozzle 32 can be inclined with respect to the movable carriage 20 (or with respect to the LED substrate 1 to be put thereon).

The nozzle 32 has a built-in temperature adjusting system, and thus temperatures of materials to be sprayed can be adjusted.

The nozzle 32 is connected to a tank 36 through a connecting pipe 34.

The tank 36 pools the application liquid 40. The tank 36 has a stirring bar therein, and the application liquid 40 is continuously stirred. When the application liquid 40 is the fluorescent substance dispersion liquid, the fluorescent substance having a high specific gravity may settle out of the fluorescent substance dispersion liquid, and thus concentration distribution of the fluorescent substance in the fluorescent substance dispersion liquid may become uneven. By stirring the fluorescent substance dispersion liquid with the stirring bar in the tank 36, settlement of the fluorescent substance having a high specific gravity can be suppressed. Accordingly, the fluorescent substance can be kept in a dispersed state in the fluorescent substance dispersion liquid.

Here, as for the spraying unit 30, instead of supplying air to the nozzle 32, there is an adoptable mechanism such that pressure is supplied directly to the application liquid 40 in the tank 36 using such as a motor as a driver to spray the application liquid 40, or to push the application liquid 40 out from, the nozzle 32. When the mechanism for pushing the application liquid 40 out is adopted, unevenness of the pressure supplied to the application liquid 40 is set to be 10% or less.

The inspecting unit 50 has an LED element 52 and a luminance colorimeter 54.

The LED element 52 is an element which emits the same type of light as the LED element 3.

The luminance colorimeter 54 is a measuring instrument for measuring chromaticity and brightness of received light.

In practical manufacturing of the light-emitting device 100, the fluorescent substance dispersion liquid is used as the application liquid 40 first, and sprayed to be applied in advance on a glass plate 60 for adjusting chromaticity and brightness (for a test use) to measure chromaticity and brightness of the white light beforehand (pre-spraying and applying step).

In detail, the glass plate 60 is put on the movable carriage 20, and the movable carriage 20 and the nozzle 32 of the spraying unit 30 is adjusted such that the glass plate 60 and the tip of the nozzle 32 face each other. In this state, the fluorescent substance dispersion liquid is sprayed from the nozzle 32 and applied on the glass plate 60. Thereafter, the solvent in the fluorescent substance dispersion liquid volatilizes, and a fluorescent substance layer is formed on the glass plate 60.

The glass plate 60 on which the fluorescent substance layer has been formed is moved near the inspecting unit 50, and the light-emitting element 52 is made emit light. Thereafter, chromaticity and brightness of the white light is measured with the luminance colorimeter 54 to inspect if chromaticity and brightness of the white light meet a desired value (a desired range).

The process of the pre-spraying and applying step is repeated until chromaticity and brightness of the white light become stabilized.

In the pre-spraying and applying step, if the chromaticity and brightness of the white light do not meet a desired value, such as spraying pressure and concentration of the fluorescent substance in the fluorescent substance dispersion liquid can be adjusted to make chromaticity and brightness of the white light meet a desired value. Preferably, this adjustment is performed automatically according to the measured values. However, the adjustment can be performed manually according to the measured values.

Thereafter, in the place of the glass plate 60, a plurality of the LED substrates 1 (on which the LED elements 3 have been disposed in advance) are put on the movable carriage 20, and a positional relationship between the LED substrate 1 and the nozzle 32 of the spraying unit 30 is adjusted (a position adjusting step).

In detail, as same as the arrangement of the glass plate 60, the LED substrates 1 are put on the movable carriage 20, and the LED substrate 1 and the tip of the nozzle 32 are positioned to face each other. The distance between the LED substrate 1 and the tip of the nozzle 32 is set to be from 5 to 30 cm. To evenly apply the fluorescent substance dispersion liquid on the LED element 3, it is preferable that the tip of the nozzle 32 is apart from the LED substrate 1 at a fixed distance therebetween.

Thereafter, while the LED substrate 1 and the nozzle 32 are moved relative to each other, the fluorescent substance dispersion liquid is sprayed from the nozzle 32 and applied on the LED substrate 1 (a spraying and applying step).

In detail, on one hand, the movable carriage 20 and the nozzle 32 are moved such that the LED substrate 1 and the nozzle 32 are moved forward, backward, leftward and rightward. Otherwise, either of the movable carriage 20 or the nozzle 32 can be fixed and the other can be moved forward, backward, leftward and rightward. There is also another method of application preferably used involving arranging a plurality of the LED elements 3 to be in a direction which is at the right angle to the direction in which the movable carriage 20 is moved, and performing the spraying while the nozzle 32 is moved in a direction which is at the right angle to the direction in which the movable carriage 20 is moved. Meanwhile, air is supplied to the nozzle 32 to spray the fluorescent substance dispersion liquid from, the tip of the nozzle 32 to the LED substrate 1.

After the applying of the fluorescent substance dispersion liquid on the LED substrate 1 is completed, like the spraying and applying of the fluorescent substance dispersion liquid, while the LED substrate 1 and the nozzle 32 are moved, relative to each other at a fixed distance therebetween, the precursor solution is sprayed from the nozzle 32, and applied on the LED substrate 1 on which the fluorescent substance dispersion liquid has been applied.

In the spraying and applying step, in both cases of using the fluorescent substance dispersion liquid and the precursor solution as the application liquid 40, the following operations (1)-(9), condition settings, and the like are performed.

(1) Basically, the tip of the nozzle 32 is arranged right above the LED substrate 1, and the application liquid 40 is sprayed from right, above the LED element 3.

Here, because the LED element 3 is in a cuboid, shape, in addition, to or instead of spraying the application liquid 40 from right above the LED element 3, for example, the nozzle 32 can be tilted to spray the application liquid 40 from diagonal directions with respect to four corners of the LED element 3.

When the application liquid 40 is sprayed from the four diagonal directions at small spraying angles as described above, the application liquid 40 can also be applied evenly on the side faces of the LED element 3.

The spraying angle of the nozzle 32 can be set adequately as needed. Preferably, the spraying angle is 45°.

(2) Spraying volume of the application liquid 40 is fixed so as to fix an amount of the fluorescent substance per unit area. A time-dependent unevenness of spraying volume of the application liquid 40 is within 10%, and preferably within 1%.

(3) Temperature adjustment is performed on the nozzle 32 to adjust viscosity of the application liquid 40 when sprayed. Preferably, the temperature of the application liquid 40 is adjusted to 40° C. or less, or adjusted according to viscosity of the application liquid 40.

In this case, the LED substrate 1 can be put in room temperatures. Otherwise, a temperature adjusting system can be equipped with the movable carriage 20 to adjust the temperature of the LED substrate 1.

If the temperature of the LED substrate 1 is set to a high temperature ranging from 30 to 100° C., the organic solvent in the application liquid 40 which has been sprayed on the LED substrate 1 can volatilize rapidly. Thus, the application liquid 40 can be prevented from dropping from, the LED substrate 1. On the contrary, if the temperature of the LED substrate 1 is set to a low temperature ranging from 5 to 20° C., the solvent can volatilize slowly. Thus, the application liquid 40 can be applied evenly along the outer faces of the LED element 3, and further, layer density and layer strength of the wavelength conversion portion 6 can be increased, and a fine layer can be formed.

(4) An environmental atmosphere (temperature and humidity) is fixed to stabilize the spraying of the application liquid 40.

Especially, when a polysilazane is used as the organometallic compound of the precursor solution, such a precursor solution itself may become solidified because a polysilazane has hygroscopicity. Thus, preferably, temperature is lowered when such a precursor solution is sprayed.

(5) Between the spraying unit 30 and the LED substrate 1, a mask formed according to a shape of the LED element 3 is arranged, and the application liquid 40 is sprayed to pass through the mask.

As for the mask, it is required that a material for the mask is not dissolved in the organic solvent of the application liquid 40. Preferably, in terms of recovering materials attached on the mask such as the fluorescent substance, the material for the mask is flammable.

(6) After the spraying and applying of the fluorescent substance dispersion liquid and the precursor solution on one of the LED substrates 1 is completed, the same operations as described above are performed on another LED substrate 1. The fluorescent substance dispersion liquid and the precursor solution are sequentially sprayed to be applied on the LED elements 3 arranged on the plurality of the LED substrates 1.

Here, instead of spraying and applying both the fluorescent substance dispersion liquid and the precursor solution on each of the LED substrate 1, it can be performed that the fluorescent substance dispersion liquid is sprayed and applied on the plurality of the LED substrates 1 one after another, and thereafter the precursor solution is sprayed and applied on the plurality of the LED substrates 1 on which the fluorescent substance dispersion liquid has been sprayed and applied one after another.

When the fluorescent substance dispersion liquid or the precursor solution is sprayed and applied on the plurality of the LED substrates 1 one after another, the spraying of the application liquid 40 can be stopped at every timing of replacing the LED substrates 1 with one another to spray the application liquid 40 intermittently. If the application liquid 40 is sprayed continuously, spraying volume of the application liquid 40 to the LED substrates 1 can be stabilized. When the application liquid 40 is sprayed intermittently, consumed amount of the application liquid 40 can be saved.

(7) During the spraying and applying step, every timing of completing the spraying and applying of the fluorescent substance dispersion liquid on a predetermined number of the LED substrates 1, chromaticity and brightness of the white light can be inspected in practice. Obtained results from the inspection can be used as feedback for adjusting such as spraying volume, spraying pressure, spraying temperature (temperature of the nozzle 32) of the fluorescent substance dispersion liquid (an inspecting step).

That is, in the inspecting step, one of the LED substrates 1 on which the fluorescent substance dispersion liquid has been sprayed and applied is moved near the inspecting unit 50, and the LED element 3 is made emit light. Thereafter, chromaticity and brightness of the white light are measured with the luminance colorimeter 54, and according to the measured results, such as spraying volume, spraying pressure, spraying temperature (temperature of the nozzle 32) of the fluorescent substance dispersion liquid can be adjusted.

Instead of using the LED substrate 1 on which the fluorescent substance dispersion liquid has been sprayed and applied, the fluorescent substance dispersion liquid can be sprayed to be applied on the glass plate 60 to use it for inspecting chromaticity and brightness of the white light. When the glass pate 60 is used, the LED element 52 is made emit light and chromaticity and brightness of the white light is measured.

(8) During the spraying and applying step, the nozzle 32 can be cleaned.

In this case, a cleaning tank for pooling a cleaning solution is arranged near the spraying unit 30, and the tip of the nozzle 32 is dipped in the cleaning tank when, for example, the spraying of the application liquid 40 is stopped or chromaticity and brightness of the white light are being inspected, to prevent the tip portion of the nozzle 32 from being dried.

As for the cleaning solution, a solution capable of dissolving the application liquid 40 can be used.

In addition, when the spraying and applying step is stopped, the application liquid 40 may harden to plug an spraying exit of the nozzle 32. Thus, it is preferable to dip the nozzle 32 in the cleaning tank, or to clean the nozzle 32 at the start of the spraying and applying step.

Here, the cleaning of the nozzle 32 can be performed, before performance of the spraying and applying step itself.

(9) In the spraying and applying step, the application liquid 40 is sprayed in mists. Thus, when the organic solvent in the fluorescent substance dispersion liquid volatilizes, powder such as the fluorescent substance and the inorganic fine particles may be splattered. Thus, preferably, the whole manufacturing device 10 is encased with, for example, a housing so as to perform dust collection and exhaust ventilation through a filter during performance of the spraying and applying step or the inspecting step.

If the fluorescent substance is collected with the filter, the fluorescent substance, which is expensive, can be reused.

After the above, the LED substrate 1 on which the fluorescent substance dispersion liquid and the precursor solution have been applied is moved to a sintering furnace to be fired (a firing step).

In the firing step, a treating temperature (a firing temperature) is set to a extent, that the LED element 3 is not broken, ranging from 100 to 300° C., preferably from 130 to 170° C., more preferably from 140 to 160° C., and most preferably around 150° C.

As a result, the precursor solution is sintered, and the wavelength conversion portion 6 where the clear ceramic layer includes the fluorescent substance, the layered silicate mineral, and the inorganic fine particles is manufactured (formed).

Here, after the precursor solution is sintered, the top of the wavelength conversion portion 6 can be sealed with a silicone resin by using a dispenser. In this case, time-dependent deterioration of the wavelength conversion portion 6 can be suppressed, and adhesion properties of the wavelength conversion portion 6 to the LED substrate 1 and the LED element 3 can be enhanced.

According to the above first embodiment, the fluorescent substance dispersion liquid, containing the fluorescent substance is sprayed and applied on the LED element 3, and thereafter the precursor solution is applied on the LED element 3 on which the fluorescent substance dispersion liquid has been applied. Accordingly, the fluorescent substance can be applied on the LED element 3 in an evenly-dispersed state, and thus the wavelength, conversion portion 6 where the fluorescent substance is evenly dispersed in the ceramic layer having a high heat durability can be formed.

Second Embodiment

A second embodiment differs from the first embodiment in the following respects, and the other respects are the same as the first embodiment.

Figure 3:
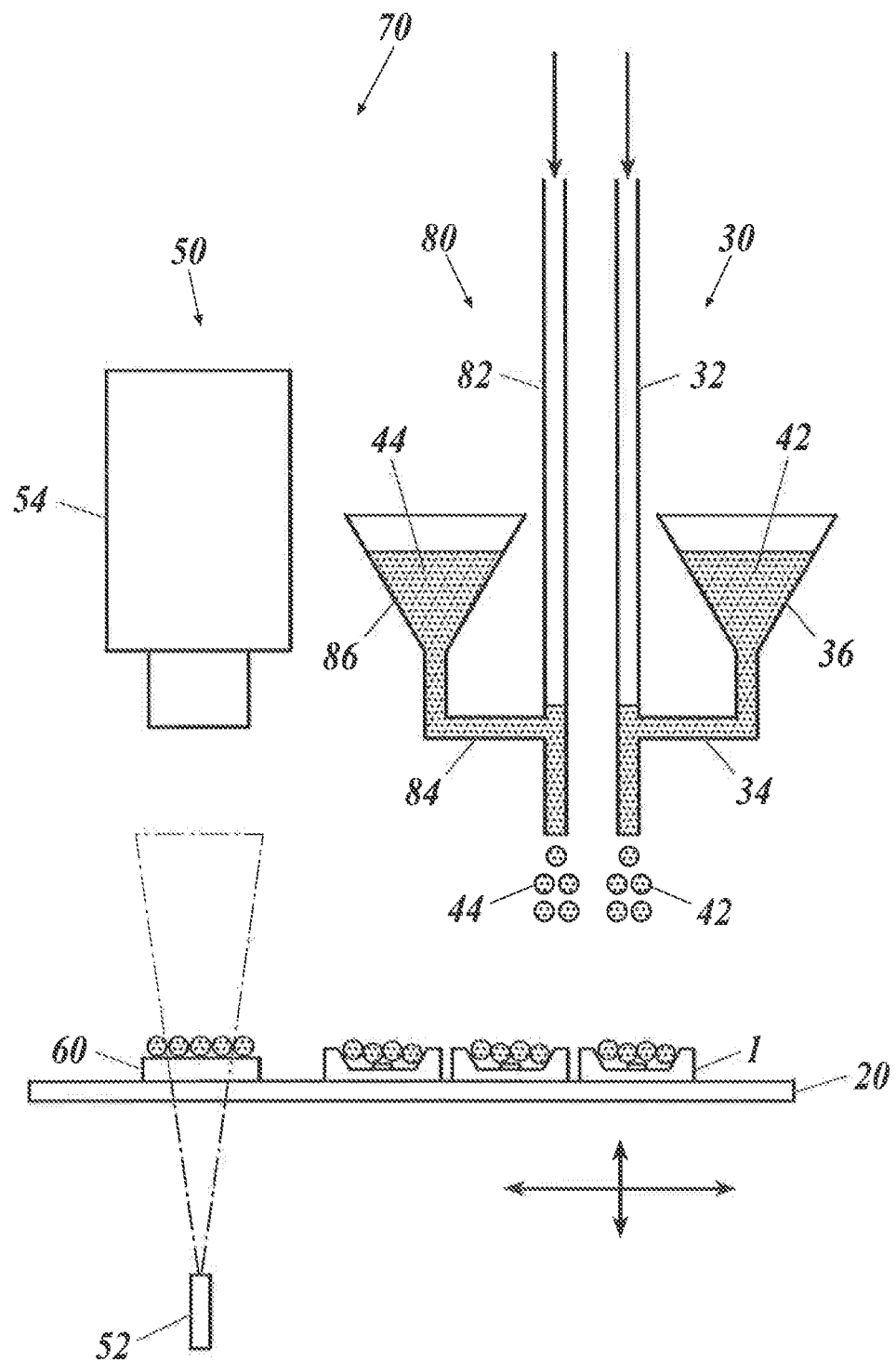
FIG. 3 This is a schematic diagram for explaining schematically a manufacturing device and a manufacturing method of a light-emitting device of a second embodiment.

In the second embodiment, instead of the manufacturing device 10 of FIG. 2, a manufacturing device 70 of FIG. 3 is used.

The manufacturing device 70 has a second spraying unit 80 in addition to the spraying unit 30.

The spraying unit 80 has the same configuration as the spraying unit 30, and a tank 86 is connected to a nozzle 82 through a connecting pipe 84.

The tank 36 of the spraying unit 30 pools the above-described precursor solution (42, the solution where the organometallic compound is mixed with the organic solvent).

On the other hand, the tank 86 of the spraying unit 80 pools the above-described liquid where the fluorescent substance, the layered silicate mineral, and the inorganic fine particles are dispersed in the solvent (hereinafter referred to as a "fluorescent substance dispersion liquid 44").

In the second embodiment, the materials of which the wavelength conversion portion 6 are composed are sprayed from the spraying unit 30 and the spraying unit 80 separately.

Here, the layered silicate mineral and the inorganic fine particles in the fluorescent substance dispersion liquid 44 can also be contained in the precursor solution 42.

In practical manufacturing of the wavelength conversion portion 6, in the pre-spraying and applying step, the fluorescent substance dispersion liquid 44 can be sprayed and applied in advance on the glass plate 60 for adjusting chromaticity and brightness (for a test use), to measure chromaticity and brightness of the white light beforehand.

In the spraying and applying step, the nozzles 32 and 82 can be used (for spraying the precursor solution 42 and the fluorescent substance dispersion liquid 44) simultaneously or separately.

When the nozzles 32 and 32 are used simultaneously, if both the nozzles 32 and 82 are moved while their positional relationship is fixed, chromaticity of the wavelength conversion portion 6 can be stabilized.

Preferably, when the nozzles 32 and 82 are used separately, the fluorescent substance dispersion liquid 44 is sprayed from the nozzle 82 on each of the LED substrates 1 first, and thereafter the precursor solution 42 is sprayed from the nozzle 32 on the LED substrate 1.

The precursor solution 42 can be sprayed right after the spraying of the fluorescent substance dispersion liquid 44, or can be sprayed at a predetermined time interval after the spraying of the fluorescent substance dispersion liquid 44.

In the case of the spraying after a predetermined time interval, the solvent, in the fluorescent substance dispersion liquid 44 can volatilize, and thus layer strength of the wavelength conversion portion 6 can be enhanced.

In the spraying and applying step, basically, the tips of the nozzle 32 and 82 are arranged right above the LED substrate 1, and each of the fluorescent substance dispersion liquid 44 and the precursor solution 42 is respectively sprayed from right above the LED element 3.

Preferably, the nozzle 82 is tilted to spray the fluorescent substance dispersion liquid 44 from the diagonal directions to the four corners of the LED element 3.

When the fluorescent substance dispersion liquid 44 is sprayed from the four diagonal directions at small spraying angles as described above, fluorescent substance dispersion liquid 44 can also be applied evenly on the side faces of the LED element 3.

The spraying angle can be set adequately as needed. Preferably, the spraying angle is 45°.

Of course, like in the spraying of the fluorescent substance dispersion liquid 44, the nozzle 32 can be tilted to spray the precursor solution 42 from the diagonal directions to the four corners of the LED element 3.

In the spraying and applying step, temperature adjustment is performed respectively on the nozzles 32 and 82 to adjust viscosities of the precursor solution 42 and the fluorescent substance dispersion liquid 44 to be the most preferred viscosities respectively.

In the spraying and applying step, masks respectively exclusive to the precursor solution 42 and the fluorescent, substance dispersion liquid 44 can be used, i.e., can be used according to materials to be sprayed.

If the masks are used exclusively, the fluorescent substance, which is expensive, in the fluorescent substance dispersion liquid 44 can be collected and reused.

During the spraying and applying step, the nozzle 82 can be cleaned.

In this case, a cleaning tank which pools a cleaning solution is arranged near the spraying unit 80, and the tip of the nozzle 82 is dipped in the cleaning tank when, for example, the spraying of the application liquid 40 is stopped or chromaticity and brightness of the white light are being inspected, to prevent the tip portion of the nozzle 82 from being dried.

As for the cleaning solution, a solution capable of dissolving the fluorescent substance dispersion liquid 44 can be used.

In addition, when, the spraying and applying step is stopped, the fluorescent substance dispersion liquid 44 may harden to plug an spraying exit of the nozzle 82. Thus, it is preferable to dip the nozzle 82 in the cleaning tank, or to clean the nozzle 82 at the start of the spraying and applying step.

Here, the cleaning of the nozzle 82 can be performed before performance of the spraying and applying step itself.

Of course, like the nozzle 82, the nozzle 32 can be cleaned in the same manner as the cleaning of the nozzle 62 before or during the spraying and applying step.

In the firing step, the LED substrate 1 on which both the fluorescent substance dispersion liquid 44 and the precursor solution 42 have been sequentially applied can be heated and fired. Otherwise, the LED substrate 1 on which the fluorescent substance dispersion liquid 44 has been applied can be heated first to volatilize the solvent and form the fluorescent substance layer, and subsequently the precursor solution 42 can be applied, on the LED substrate 1 followed by heating and firing.

Also when the fluorescent substance dispersion liquid 44 and the precursor solution 42 are heated and fired simultaneously, treating temperature (firing temperature) is set to an extent that the LED element 3 is not broken, ranging from 100 to 300° C., preferably from 130 to 170° C., more preferably from 140 to 160° C., and most preferably about 150° C.

When the fluorescent substance dispersion liquid 44 and the precursor solution 42 are heated and fired separately, each treating temperature (firing temperature) is set to an extent that the LED element 3 is not broken, ranging from 100 to 300° C., preferably from 130 to 170  C., more preferably from 140 to 160° C., and most preferably about 150° C.

According to the above second embodiment, the precursor solution 42 and the fluorescent substance dispersion liquid 44 are sprayed and applied on the LED element 3 separately. Thus, such as spraying volume, spraying pressure, viscosity of each of the liquid and the solution can be optimized more adequately, and the fluorescent substance can be applied evenly on the LED element 3 in a more dispersed state.

Here, in the first and second embodiments, the use of one nozzle 32 and the use of two nozzles 32 and 82 are exemplary described. However, the number of the nozzles can be three or more (can be modified) according to types of materials to be sprayed.

For example, in the case where fluorescent substances each of which emits red (R), blue (B), or yellow (Y) light respectively are used to emit white light by mixing these three types of lights, three spraying units which are the same as the spraying unit 30 can be used to spray solutions each of which contains each fluorescent substance from three nozzles separately.

EXAMPLES (1) Preparation of Sample (1.1) Preparation of Fluorescent Substance

As the raw materials, $Y_2O_3$ (7.41 g), $Gd_2O_3$ (4.01 g), $CeO_2$ (0.63 g), and $Al_2O_3$ (7.77 g) were well mixed, and an adequate amount of ammonium fluoride as a flux was added therewith.

Then, this mixture was put in an aluminum crucible and fired under a reducing atmosphere by ventilating nitrogen gas with hydrogen gas at a temperature ranging from 1350 to 1450° C. for from 2 to 5 hours to obtain a fired product (($Y_{0.72}Gd_{0.24}$)$_3$ $Al_5O_{12}$:$Ce_{0.04}$).

The obtained fired product was milled, washed, separated, and dried to obtain yellow fluorescent substance particles having a volume-mean particle diameter of about 1 μm. Thereafter, an emission wavelength of an excitation light of the fluorescent substance particles at a wavelength of 465 nm was measured, and a peak wavelength was at about 570 nm (a glass substrate).

(1.2) Manufacture of Light-emitting Device

(1.2.1) Example 1

First, 0.11 g of hydrophilic smectite whose surface was not treated (Lucentite SWN, Co-op Chemical Co., Ltd.) was mixed with and dispersed, in 2.2 g of purified water. Then, 1 g of the above prepared fluorescent substance and 3.85 g of IPA (iso propanol) were further mixed therewith to prepare a fluorescent substance dispersion liquid. This fluorescent substance dispersion liquid was sprayed by the spray coating method on a concave portion of an LED substrate (a substrate on which 20 blue LED chips have been disposed, in advance) and the surfaces of the LED chips so as to form a fluorescent substance layer having a layer thickness of 35 μm after heated. Then heating was performed thereon at 50° C. for 10 minutes to form the fluorescent substance layer.

Thereafter, a precursor solution (14% polysiloxane and 86% isopropyl alcohol by weight) was sprayed, by the spray coating method on the fluorescent substance layer. The fluorescent substance layer was impregnated with the precursor solution, and the precursor solution filled apertures formed around the surfaces of the fluorescent substance and the hydrophilic smectite, which are compositions of the fluorescent substance layer. Then heating is performed thereon at 150° C. for 1 hour to form a wavelength conversion portion.

A light-emitting device manufactured by these processes was named "Sample (Example 1)".

(1.2.2) Example 2

First, 0.11 g of hydrophilic smectite whose surface was not treated (Lucentite SWN, Co-op Chemical Co., Ltd.) was mixed with and dispersed in 2.2 g of purified water. Then, 1 g of the above prepared fluorescent substance and 4.4 g of IPA were further mixed, therewith to prepare a fluorescent substance dispersion liquid. This fluorescent substance dispersion liquid was sprayed by the spray coating method on the concave portion of the LED substrate (the substrate on which 20 blue LED chips have been disposed in advance) and the surfaces of the LED chips so as to form a fluorescent substance layer having a layer thickness of 35 μm after heated. Then heating was performed thereon at 50° C. for 10 minutes to form a fluorescent substance layer.

Thereafter, a precursor solution (NL120-20; 20% polysilazane and 80% dibuthylether by weight; AZ Electronic Materials) was sprayed by the spray coating method, on the fluorescent substance layer. The fluorescent substance layer was impregnated with the precursor solution, and the precursor solution filled apertures formed around the surfaces of the fluorescent substance and the hydrophilic smectite, which are compositions of the fluorescent substance layer. Then heating is performed thereon at 150° C. for 1 hour to form a wavelength conversion portion.

A light-emitting device manufactured by these processes was named "Sample (Example 2)".

(1.2.3) Example 3

First, 0.05 g of hydrophilic smectite whose surface was not treated (Lucentite SWN, Co-op Chemical Co., Ltd.), 0.05 g of inorganic particles (RX300, Nippon Aerosil Co., Ltd., particle diameter of 7 nm), and 0.75 g of the prepared fluorescent substance were mixed with 0.5 g of water, and further 1 g of isopropyl alcohol (IPA) were mixed, therewith, to prepare a fluorescent substance dispersion liquid. This fluorescent substance dispersion liquid was sprayed by the spray coating method on the concave portion of the LED substrate (the substrate on which 20 blue LED chips have been disposed in advance) and the surfaces of the LED chips so as to form a fluorescent substance layer having a layer thickness of 55 μm after heated. Then heating was performed thereon at 50° C. for 1 hour to form a fluorescent substance layer.

Thereafter, a precursor solution (14% polysiloxane and 86% isopropyl alcohol by weight) was sprayed by the spray coating method on the fluorescent substance layer. The fluorescent substance layer was impregnated with the precursor solution, and the precursor solution filled apertures formed around the surfaces of the fluorescent substance, the hydrophilic smectite and the inorganic particles, which are compositions of the fluorescent, substance layer. Then heating is performed thereon at 150° C. for 1 hour to form a wavelength conversion portion.

A light-emitting device manufactured by these processes was named "Sample (Example 3)".

(1.2.4) Example 4

First, 0.04 g of synthetic mica (MICROMICA MK-100, Co-op Chemical Co., Ltd.) and 0.81 g of the above fluorescent substance were mixed with 1 g of propylene glycol to prepare a fluorescent substance dispersion liquid. This fluorescent substance dispersion liquid was sprayed by the spray coating method on the concave portion of the LED substrate (the substrate on which 20 blue LED chips have been disposed in advance) and the surfaces of the LED chips so as to form, a fluorescent substance layer having a layer thickness of 50 μm after heated. Then drying was performed thereon, at 50° C. for 1 hour to form a fluorescent substance layer.

Thereafter, a precursor solution (14% polysiloxane and 86% IPA by weight) was sprayed, by the spray coating method on the fluorescent substance layer. The fluorescent substance layer was impregnated with the precursor solution, and the precursor solution filled, apertures formed around the surfaces of the fluorescent substance and the synthetic mica, which are compositions of the fluorescent substance layer. Then heating is performed thereon at 150° C. for 1 hour to form a wavelength conversion portion.

A light-emitting device manufactured by these processes was named "Sample (Example 4)".

(1.2.5) Example 5

First, 0.065 g of inorganic particles (RX300, Nippon Aerosil Co., Ltd., particle diameter of 7 nm), 0.025 g of hydrophilic smectite (Lucentite SWN, Co-op Chemical Co., Ltd.), and 1 g of the fluorescent substance were mixed with 1 g of 1,3-butanediol and 0.75 g of isopropyl alcohol to prepare a fluorescent substance dispersion liquid. This fluorescent substance dispersion liquid was sprayed by the spray coating method on the concave portion of the LED substrate (the substrate on which 20 blue LED chips have been disposed in advance) and the surfaces of the LED chips so as to form a fluorescent substance layer having a layer thickness of 45 μm after heated. Then drying was performed thereon at 50° C. for 1 hour to form a fluorescent substance layer.

Thereafter, a precursor solution (14% polysiloxane and 86% IPA by weight) was sprayed by the spray coating method on the fluorescent substance layer. The fluorescent substance layer was impregnated with the precursor solution, and the precursor solution filled apertures formed around the surfaces of the fluorescent substance, the hydrophilic smectite and the inorganic particles, which are compositions of the fluorescent substance layer. Then heating is performed thereon at 150° C. for 1 hour to form a wavelength conversion portion.

A light-emitting device manufactured by these processes was named "Sample (Example 5)".

(1.2.6) Comparative Example 1

First, 0.3 g of the above prepared fluorescent substance was mixed with 1 g of a polysiloxane dispersion liquid (14% polysiloxane and 86% isopropyl alcohol by weight) to prepare a application liquid for forming a wavelength conversion portion.

This application liquid for forming a wavelength conversion portion was sprayed and applied on the concave portion of the LED substrate (the substrate on which 20 blue LED chips have been disposed in advance) and the surfaces of the LED chips so as to form a fluorescent substance layer having a layer thickness of 45 μm after heated. Then heating was performed thereon at 150° C. for 1 hour to form a wavelength conversion portion.

A light-emitting device manufactured by these processes was named "Sample (Comparative Example 1)".

As for the Samples of the above light-emitting devices, five sample pieces (sheets) for each Sample of Examples 1-5 and Comparative Example 1 were prepared.

(2) Evaluation of Sample (2.1) Evaluation of Layer Thickness of the Wavelength Conversion Portion Layer thicknesses of each of the Samples were measured with a laser hologage (Mitutoyo Corporation), and a variation of the layer thicknesses was evaluated.

An evaluation result is shown in Table 1.

Regarding the evaluation of the layer thickness shown in Table 1, an average of layer thicknesses on the LED chips of one sample piece on which the applying was firstly performed among the five sample pieces of the Sample was determined as a standard thickness (100%). If a variation of each average of the layer thicknesses on the LED chips of the other four pieces of the Sample to the standard thickness was within ±10%, it was evaluated as "⊚ (double circle)"; if within ±20%, evaluated as "○ (circle)"; if within ±30%, evaluated as "Δ (triangle)"; and if exceeded ±40%, evaluated as "× (cross)".

In Table 1, viscosities of the fluorescent substance dispersion liquids (as for the samples of Comparative Example 1, the application liquid for forming the wavelength conversion portion) are also shown.

The viscosities of the fluorescent substance dispersion liquids and the application liquid for forming the wavelength conversion portion were measured with a vibrational viscometer (VM-10A-L, CBC Co., Ltd.).

(2.2) Measurement of Chromaticity

The LED chips of the Samples were made emit light, and chromaticity of the emitted light was measured, with a spectroradiometer (CS-1000A, Konica Minolta Sensing Inc.).

A measurement result is shown in Table 1.

Chromaticity is defined by an intersection at which a straight line connecting a certain point and the origin intersects the plane x+y+x=1, in the CIE-XYZ color coordinate system representing a color space by the XYZ coordinates. This time, chromaticity was defined by the XY coordinates, and a Z coordinate obtained according to a relationship of x+y+z=1 was omitted.

Chromaticity of white light is (0.33, 0.33). When chromaticity of light is closer to these values, the light is closer to white light. When a value of the X coordinate is small, a color of the light is bluish white. When a value of the X coordinate is large, a color of the light is yellowish white.

Five chromaticities in Table 1 represent chromaticity of each of the five samples. The value of each of the sample is an average of three chromaticities obtained from measuring any three LED chips, which were made emit light, among the LED chips on each of the LED substrate.

TABLE 1

| SAMPLE | VISCOSITY (mPa·s) | VARIATION OF THICKNESS | CHROMATICITY | 1 | 2 | 3 | 4 | 5 |
|---|---|---|---|---|---|---|---|---|
| EXAMPLE 1 | 80 | ⊚ | X VALUE | 0.32 | 0.33 | 0.32 | 0.32 | 0.34 |
|  |  |  | Y VALUE | 0.33 | 0.33 | 0.32 | 0.33 | 0.33 |
| EXAMPLE 2 | 34 | ○ | X VALUE | 0.33 | 0.32 | 0.32 | 0.33 | 0.34 |
|  |  |  | Y VALUE | 0.34 | 0.32 | 0.32 | 0.33 | 0.33 |
| EXAMPLE 3 | 150 | ⊚ | X VALUE | 0.34 | 0.32 | 0.33 | 0.33 | 0.33 |
|  |  |  | Y VALUE | 0.33 | 0.33 | 0.33 | 0.34 | 0.33 |
| EXAMPLE 4 | 180 | ○ | X VALUE | 0.3 | 0.335 | 0.325 | 0.33 | 0.315 |
|  |  |  | Y VALUE | 0.315 | 0.35 | 0.335 | 0.34 | 0.33 |
| EXAMPLE 5 | 320 | ○ | X VALUE | 0.324 | 0.33 | 0.328 | 0.325 | 0.338 |
|  |  |  | Y VALUE | 0.338 | 0.346 | 0.342 | 0.342 | 0.354 |
| COMPARATIVE EXAMPLE 1 | 4 | × | X VALUE | 0.24 | 0.26 | 0.27 | 0.36 | 0.35 |
|  |  |  | Y VALUE | 0.21 | 0.24 | 0.25 | 0.36 | 0.35 |

(3) Conclusion

As shown in Table 1, in the sample pieces of Comparative Example 1, because the application liquid was applied in a state that the fluorescent substance dispersion liquid and the precursor solution were not separated but mixed, and the application liquid, did not contain the layered silicate mineral, the viscosity of the application liquid itself was low and the layer thicknesses of the wavelength conversion portions were not constant, and further, the chromaticities largely distributed.

On the other hand, in the sample pieces of Example 1-5, the layer thicknesses of the wavelength conversion portions were fixed, and the variations of the chromaticities were suppressed.

Thus, in the sample pieces of Examples 1-5, it was proved that particles of the fluorescent substance were evenly dispersed in the wavelength conversion portions.

Industrial Applicability

The present invention is suitably applicable to a method of manufacturing a light-emitting device for dispersing a fluorescent substance evenly in a translucent material having a high heat durability.

EXPLANATION OF REFERENCE NUMERALS

1 LED substrate
2 metal portion
3 LED element
4 projecting electrode (bump)
6 wavelength conversion portion
10 manufacturing device
20 movable carriage
30 spraying unit
32 nozzle
34 connecting pipe
36 tank
40 application liquid
42 precursor solution
44 fluorescent substance dispersion liquid
50 inspecting unit
52 LED element
54 luminance colorimeter
60 glass plate
70 (second) manufacturing device
80 spraying unit
82 nozzle
84 connecting pipe
86 tank
100 light-emitting device

The invention claimed is:

1. A method of manufacturing a light-emitting device which comprises a light-emitting element which emits light of a predetermined wavelength and a wavelength conversion portion which comprises a fluorescent substance which is excited by the light emitted from the light-emitting element so as to emit fluorescence of a wavelength different from the predetermined wavelength, the method comprising:
   forming a wavelength conversion portion on a light-emitting element, wherein
   the forming the wavelength conversion portion comprises:
   forming a fluorescent substance layer on the light-emitting element using a fluorescent substance dispersion liquid comprising a fluorescent substance and a layered silicate mineral;
   applying a precursor solution comprising an organometallic compound on the fluorescent substance layer; and
   heating the precursor solution applied on the fluorescent substance layer,
   wherein the fluorescent substance dispersion liquid has no organometallic compound to bind the fluorescent substance.

2. The method of manufacturing the light-emitting device according to claim 1, wherein a heating temperature ranges from 100 to 300° C. in the heating the precursor solution applied on the fluorescent substance layer.

3. The method of manufacturing the light-emitting device according to claim 1, wherein the forming a fluorescent substance layer on the light-emitting element comprises spraying the fluorescent substance dispersion liquid using a first nozzle, and the applying the precursor solution on the fluorescent substance layer is spraying the precursor solution using a second nozzle which is different from the first nozzle.

4. The method of manufacturing the light-emitting device according to claim 3, further comprising cleaning the first nozzle before the spraying the fluorescent substance dispersion liquid on the light-emitting element.

5. The method of manufacturing the light-emitting device according to claim 3, wherein, in the spraying the fluorescent substance dispersion liquid on the light-emitting element, the spraying the fluorescent substance dispersion liquid is stopped intermittently, and during the intermittence, a tip of the first nozzle is dipped in a cleaning solution.

6. The method manufacturing the light-emitting device according to claim 3, further comprising:
   spraying the fluorescent substance dispersion liquid to apply the fluorescent substance dispersion liquid on a glass plate for adjusting chromaticity and brightness; and
   measuring the chromaticity and the brightness of the glass plate on which the fluorescent substance dispersion liquid has been applied, before the spraying the fluorescent substance dispersion liquid on the light-emitting element.

7. The method manufacturing the light-emitting device according to claim 3, wherein, the spraying the fluorescent substance dispersion liquid on the light-emitting element is spraying the fluorescent substance dispersion liquid from a diagonal direction with respect to the light-emitting element with the first nozzle being tilted.

8. The method of manufacturing the light-emitting device according to claim 1, wherein the organometallic compound is a metal alkoxide.

9. The method of manufacturing the light-emitting device according to claim 8, wherein the metal alkoxide is a polysiloxane.

10. The method of manufacturing the light-emitting device according to claim 1, wherein the layered silicate mineral has a smectite structure.

11. The method of manufacturing the light-emitting device according to claim 1, wherein the fluorescent substance dispersion liquid further comprises inorganic fine particles.

12. The method of manufacturing the light-emitting device according to claim 1, wherein the forming the fluorescent substance layer on the light-emitting element comprises:
   applying the fluorescent substance dispersion liquid on the light-emitting device; and
   heating the fluorescent substance dispersion liquid applied on the light emitting element.

13. The method of manufacturing the light-emitting device according to claim 1, further comprising sealing a top of the wavelength conversion portion with a silicone resin, after the heating the precursor solution.

14. A method of manufacturing a light-emitting device which comprises a light-emitting element which emits light of a predetermined wavelength and a wavelength conversion portion which comprises a fluorescent substance which is excited by the light emitted from the light-emitting element so as to emit fluorescence of a wavelength different from the predetermined wavelength, the method comprising:

forming a wavelength conversion portion on a light-emitting element, wherein the forming the wavelength conversion portion comprises:

forming a fluorescent substance layer on the light-emitting element using a fluorescent substance dispersion liquid comprising a fluorescent substance and an anti-settlement agent; and applying a precursor solution comprising an organometallic compound on the fluorescent substance layer, wherein the fluorescent substance dispersion liquid has no organometallic compound to bind the fluorescent substance.

15. The method of manufacturing the light-emitting device according to claim 14, wherein the forming a fluorescent substance layer on the light-emitting element comprises spraying the fluorescent substance dispersion liquid using a first nozzle, and the applying the precursor solution on the fluorescent substance layer is spraying the precursor solution using a second nozzle which is different from the first nozzle.

16. The method manufacturing the light-emitting device according to claim 15, wherein the spraying the fluorescent substance dispersion liquid on the light-emitting element is spraying the fluorescent substance dispersion liquid from a diagonal direction with respect to the light-emitting element with the first nozzle being tilted.

17. The method manufacturing the light-emitting device according to claim 15, wherein the spraying the fluorescent substance dispersion liquid on the light-emitting element is spraying the fluorescent substance dispersion liquid passed through mask.

18. The method of manufacturing the light-emitting device according to claim 14, wherein the anti-settlement agent is a layered compound.

19. The method of manufacturing the light-emitting device according to claim 14, wherein the anti-settlement agent is a layered silicate mineral.

20. The method of manufacturing the light-emitting device according to claim 14, further comprising sealing a top of the wavelength conversion portion with a silicone resin.

* * * * *